United States Patent
Chang et al.

(10) Patent No.: US 10,725,384 B2
(45) Date of Patent: Jul. 28, 2020

(54) COMMUNICATION CONTROL METHOD

(71) Applicant: TAIWAN SEMICONDUCTOR MANUFACTURING CO., LTD., Hsinchu (TW)

(72) Inventors: Chao-Chen Chang, Taipei (TW); Shao-Wei Luo, Taipei (TW); Shang-Chieh Chien, New Taipei (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/102,865

(22) Filed: Aug. 14, 2018

(65) Prior Publication Data

US 2020/0057384 A1    Feb. 20, 2020

(51) Int. Cl.
*G03F 7/20*    (2006.01)

(52) U.S. Cl.
CPC ...... *G03F 7/70508* (2013.01); *G03F 7/70525* (2013.01)

(58) Field of Classification Search
CPC ......... H04W 74/0816; H04W 74/0808; H04W 74/08; H04W 74/00; H04W 24/10; H04W 24/00; H04L 5/0048; H04L 5/003; H04L 5/00; G03F 7/70508; G03F 7/70525
USPC ........................................................ 370/252
See application file for complete search history.

(56) References Cited

U.S. PATENT DOCUMENTS

| | | | | |
|---|---|---|---|---|
| 6,556,541 B1* | 4/2003 | Bare | ..................... | H04L 12/185 370/235 |
| 2002/0087623 A1* | 7/2002 | Eatough | .................. | H04L 41/12 709/203 |
| 2002/0181401 A1* | 12/2002 | Hagirahim | ............ | H04L 47/115 370/236 |
| 2004/0141182 A1* | 7/2004 | Schroder | ................... | G01J 3/26 356/454 |
| 2012/0079492 A1* | 3/2012 | Chambliss | ............ | G06F 9/5083 718/104 |
| 2016/0105356 A1* | 4/2016 | Dowdell | ................. | H04L 45/22 370/329 |

\* cited by examiner

*Primary Examiner* — Jeffrey M Rutkowski
*Assistant Examiner* — Luna Weissberger
(74) *Attorney, Agent, or Firm* — McClure, Qualey & Rodack, LLP

(57) ABSTRACT

A method includes operation below. A first task is performed by a control circuit according to a first request from a processor. A second request, for triggering a second task to be performed by the control circuit, is received by an interface circuit. A first data rate, for transmitting first data generated in the first task, is calculated by the interface circuit. A second data rate, for transmitting second data to be generated in the second task, is estimated by the interface circuit. The second task other than the first task is performed by the control circuit. The first data and the second data are transmitted from the control circuit to the processor in a condition that a sum of the first data rate and the second data rate complies with a bandwidth of a data switch coupled between the control circuit and the processor.

20 Claims, 10 Drawing Sheets

COMMUNICATION CONTROL METHOD

BACKGROUND

In semiconductor fabrication processes, increased density of integrated circuits has increased the complexity of processing and manufacturing ICs. There is a need to perform lithography processes with higher resolution. One of the leading lithography techniques is an extreme ultraviolet (EUV) lithography. Others include X-Ray lithography, ion beam projection lithography, and electron-beam projection lithography. To perform the lithography processes with higher resolution, a lithography device is required to transmit or collect data at a high frequency and with a high data rate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
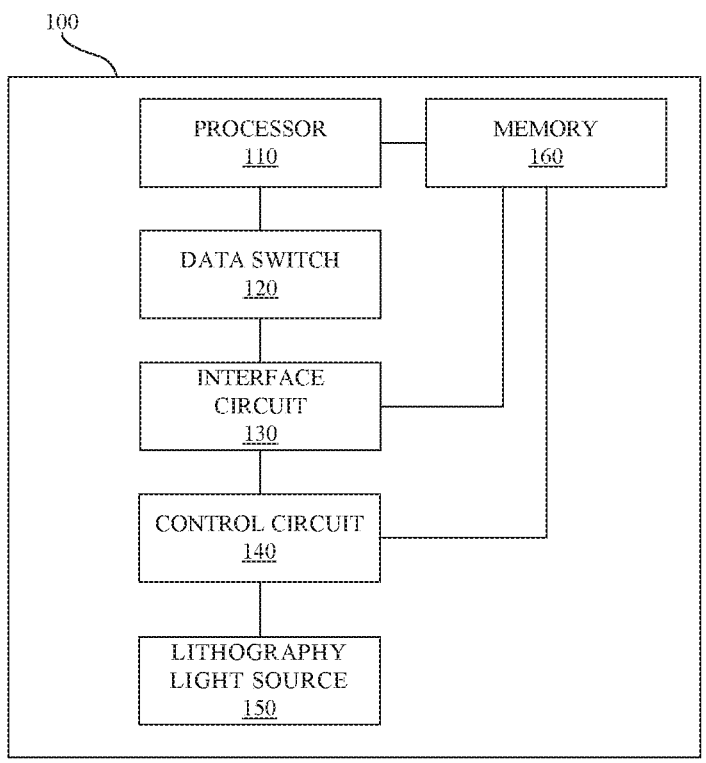
FIG. 1 is a schematic diagram of a device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

FIG. 1 is a schematic diagram of a device 100, in accordance with some embodiments of the present disclosure.

As illustratively shown in FIG. 1, the device 100 includes a processor 110, a data switch 120, an interface circuit 130, a control circuit 140, a lithography light source 150 and a memory 160. The processor 110 is coupled to the memory 160 and the data switch 120. In various embodiments, the processor 110 is a central processing unit (CPU), an application specific integrated circuit (ASIC), a multi-processor, a distributed processing system, or a suitable processing unit. Various circuits or units to implement the processor 110 are within the contemplated scope of the present disclosure.

The memory 160 stores one or more program codes for performing some tasks on the control circuit 140. For illustration, the memory 160 stores program codes encoded with executable instructions for performing some tasks on the control circuit 140. In various embodiments, the tasks include at least one of an advance diagnostic tool test, a calibration performance diagnostic test, an event trigger data collection process, a lot monitor tracking process, a daily healthy performance index feedback, a streaming feedback and a plotter feedback. The processor 110 is able to access the program codes stored in the memory 160 and generate a request for triggering one of aforesaid tasks on the control circuit 140.

In some embodiments, the memory 160 is a non-transitory computer readable storage medium encoded with, i.e., storing, a set of executable instructions for performing aforesaid tasks on the control circuit 140. In some embodiments, the non-transitory computer readable storage medium is an electronic, magnetic, optical, electromagnetic, infrared, and/or a semiconductor system (or apparatus or device). For example, the computer readable storage medium includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer readable storage medium includes a compact disk-read only memory (CD-ROM), a compact disk-read/write (CD-R/W), and/or a digital video disc (DVD).

In some embodiments, the memory 120 is a non-transitory computer readable storage medium encoded with, i.e., storing, a set of executable instructions for performing aforesaid tasks on the control circuit 140. In some embodiments, the non-transitory computer readable storage medium is an electronic, magnetic, optical, electromagnetic, infrared, and/or a semiconductor system (or apparatus or device). For example, the computer readable storage medium includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer readable storage medium includes a compact disk-read only memory (CD-ROM), a compact disk-read/write (CD-R/W), and/or a digital video disc (DVD).

Figure 2:
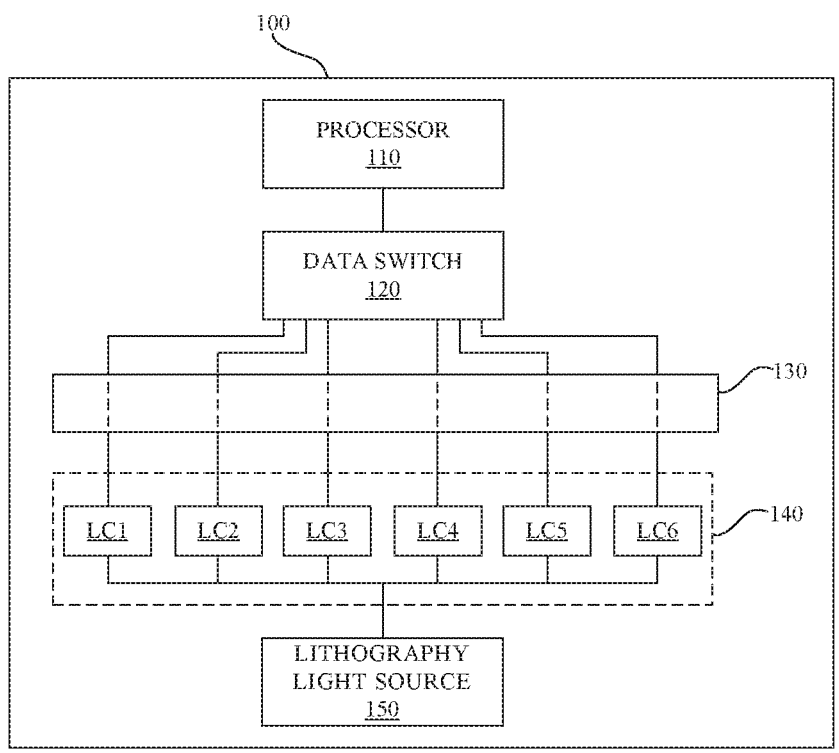
FIG. 2 is a schematic diagram of the device shown in FIG. 1 in accordance with some embodiments of the present disclosure.

FIG. 2 is a schematic diagram of the device 100 shown in FIG. 1, in accordance with some embodiments of the present disclosure. In order to facilitate the illustration of a method 300 of FIG. 3, a method 600 of FIG. 6, a method of FIG. 8 and a method 900 of FIG. 11, various terms or components regarding the device 100 are introduced with reference to FIG. 1 and FIG. 2.

For illustration, as shown in FIG. 2, the control circuit 140 includes controllers LC1-LC6. In some embodiments, the controllers LC1-LC6 are configured to control functions, including laser emission, droplet feedback, timing, emission energy, target formation metrology or focus metrology, on the lithography light source 150.

In some embodiments, the controllers LC1 and LC2 are configured to control functions of laser emission, droplet feedback, laser emission timing and laser emission energy of the lithography light source 150. The controllers LC3 and LC4 are configured to control a function of formation metrology of the lithography light source 150. The controllers LC5 and LC6 are configured to control a function of focus metrology of the lithography light source 150.

The controllers LC1-LC6 of the control circuit 140 in FIG. 2 are given for illustrative purposes. Various circuits or components for controlling the lithography light source 150 are within the contemplated scope of the present disclosure.

For illustration, as shown in FIG. 2, the data switch 120 is coupled between the processor 110 and each of the controllers LC1-LC6 in the control circuit 140. In some embodiments, the data switch 120 is configured to interchange data between the processor 110 and each of the controllers LC1-LC6 in the control circuit 140. In various embodiments, the data switch 120 is a multiplexer circuit, a network switch circuit, a network bridge circuit or a suitable data switching unit.

For illustration, as shown in FIG. 2, the interface circuit 130 is coupled between the data switch 120 and the control circuit 140. The interface circuit 130 in FIG. 2 is implemented on data paths between the processor 110 and each of the controllers LC1-LC6 in the control circuit 140. The interface circuit 130 is configured to monitor and control data transmission between the control circuit 140 and the processor 110. Details about how to monitor and control the data transmission will be introduced with reference to the method 300 in FIG. 3, the method 600 in FIG. 6, the method 800 in FIG. 8 and the method 900 in FIG. 11.

Figure 3:
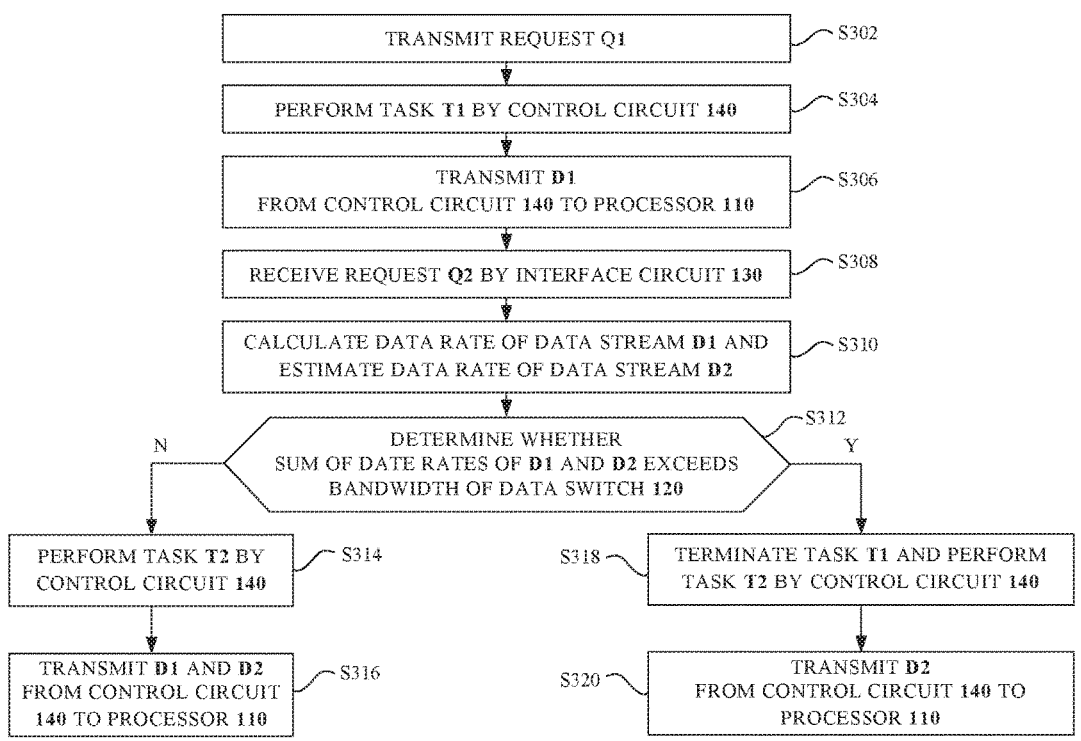
FIG. 3 is a flow chart of a method suitable to be applied on the device in FIG. 1 and FIG. 2 in accordance with some embodiments of the present disclosure.
Figure 4:
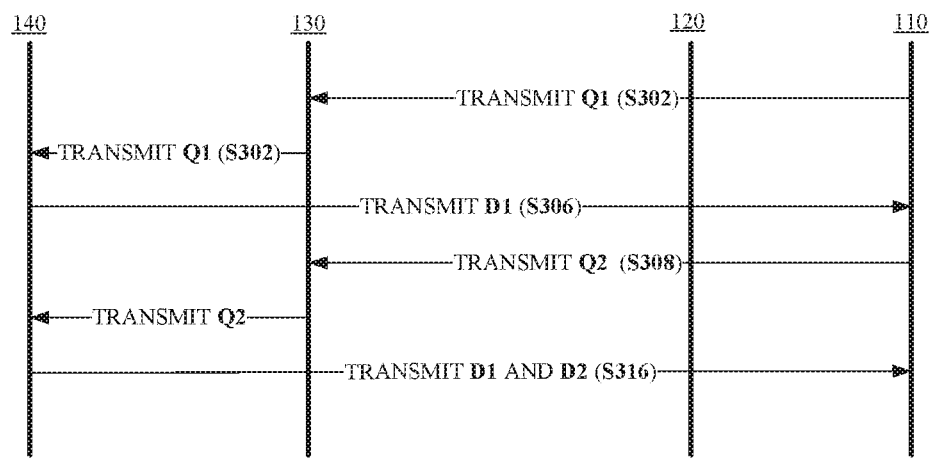
FIG. 4 is a data flow diagram illustrating data transmissions of the device performing the method in FIG. 3 in accordance with some embodiments of the present disclosure.
Figure 5:
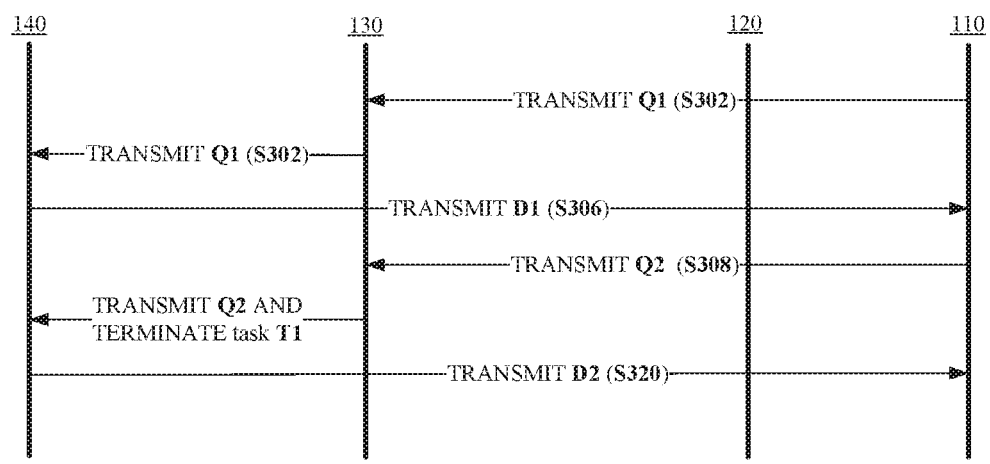
FIG. 5 is a data flow diagram illustrating data transmissions of the device performing the method in FIG. 3 in accordance with some embodiments of the present disclosure.

Reference is now made to FIG. 3, FIG. 4 and FIG. 5. FIG. 3 is a flow chart of a method 300 suitable to be applied on the device 100 in FIG. 1 and FIG. 2, in accordance with some embodiments of the present disclosure. FIG. 4 and FIG. 5 are data flow diagrams illustrating data transmissions of the device 100 performing the method 300 in FIG. 3, in accordance with some embodiments of the present disclosure. For ease of understanding, as an example, the method 300 is described below with reference to FIG. 1 and FIG. 2.

The method 300 includes operations S302-S320. The processor 110 is able to trigger the control circuit 140 to perform a task T1. In some embodiments, the task T1 is one task among an advance diagnostic tool test, a calibration performance diagnostic test, an event trigger data collection process, a lot monitor tracking process, a daily healthy performance index feedback, a streaming feedback and a plotter feedback. The processor 110 is configured to generate a request Q1 for triggering the task T1. In operation S302, the request Q1 is transmitted from the processor 110 to the control circuit 140. For illustration, as shown in FIG. 2, the request Q1 is transmitted from the processor 110 and received by the interface circuit 130, and the interface circuit 130 passes the request Q1 to the control circuit 140.

In operation S304, the control circuit 140 performs the task T1 according to the request Q1 from the processor 110. A data stream D1 will be generated in response to that the control circuit 140 performs the task T1. The data stream D1 includes monitor data, result data and/or feedback data generated by the task T1 currently performed on the control circuit 140.

In some embodiments, the task T1 can be performed on one or more controllers LC1-LC6 in the control circuit 140, and the data stream D1 is a combination of monitor data, result data and/or feedback data generated by one or more controllers LC1-LC6. For illustration, the task T1 is performed by the controllers LC1 and LC2, for example, and the data stream D1 is a combination of monitor data, result data and/or feedback data generated by the controllers LC1 and LC2.

In operation S306, the control circuit 140 transmits the data stream D1 generated in the task T1 to the processor 110. In some embodiments, while the task T1 is performing on the control circuit 140, the control circuit 140 will continuously transmit the data stream D1 to the processor 110, and the data stream D1 will occupy a portion of a bandwidth of the data switch 120.

In various embodiments, the processor 110 is able to generate another request Q2, which is utilized to trigger the control circuit 140 to perform another task T2 among an advance diagnostic tool test, a calibration performance diagnostic test, an event trigger data collection process, a lot monitor tracking process, a daily healthy performance index feedback, a streaming feedback and a plotter feedback.

In some embodiments, a type of the task T2 is different from a type of the task T1. For illustration, the task T1 is an advance diagnostic tool test and the task T2 is a calibration performance diagnostic test.

In some embodiments, the type of the task T2 is the same as the type of the task T1, and a target of the task T2 is different from a target of the task T1. For illustration, the task T1 is directed to be performed on the controllers LC1 and LC2 and the task T2 is directed to be performed on the controllers LC3 and LC4.

In operation S308, the interface circuit 130 receives the request Q2 from the processor 110. The request Q2 is utilized for triggering the task T2 to be performed by the control circuit 140. In some embodiments, the request Q2 will be evaluated by the interface circuit 130 before reaching the control circuit 140. Based on operations S310 and S312, the interface circuit 130 will decide whether to pass the request Q2 to the control circuit 140 or not.

In operation S310, the interface circuit 130 calculates a data rate for transmitting the data stream D1 generated in the task T1, and also the interface circuit 130 estimates another data rate for transmitting data stream D2 to be generated in the task T2.

In some embodiments, the data stream D1 is already generated in the task T1 currently performed on the control circuit 140, such that the data rate of the data stream D1 can be calculated by measuring an actual data throughput in transmission of the data stream D1. In some embodiments, the actual data throughput in transmission of the data stream D1 can be measured by the interface circuit 130 or the data switch 120.

In some embodiments, the request Q2 includes a type indicator of the task T2 to be performed on the control circuit 140. Since the data stream D2 is not generated yet, the data rate of the data stream D2 is estimated by the interface circuit 130, for example, according to the type indicator in the request Q2. In some embodiments, the interface circuit 130 recognizes the type indicator in the request Q2, matches the type indicator with a previously performed task on the control circuit 140, and estimates the data rate corresponding to the request Q2 according to an average data rate in association with the previously performed task. If the type indicator of the task T2 in the request Q2 indicates an advance diagnostic tool test and the control circuit 140 has performed three tasks with the same type, i.e., the advance diagnostic tool test, the data rate corresponding to the request Q2 will be examined according to an average data rate of these three performed tasks.

In some embodiments, the memory 160 may store a lookup table. The lookup table records task types and reference data rates in association with the task types. A demonstrational example of the lookup table can be referred to following Table 1. For illustration, task types and reference data rates are described as embodiments in Table 1, but the present disclosure is not limited in this regard. The number and configuration of the task types and the reference data rates in following embodiments are given for illustrative purposes. Various numbers and configurations of the task types and the reference data rates in following embodiments are within the contemplated scope of the present disclosure.

TABLE 1

| Task type | Reference data rate |
|---|---|
| Advance diagnostic tool test | 80 MB/s |
| Calibration performance diagnostic test | 60 MB/s |
| Event trigger data collection process | 40 MB/s |
| Lot monitor tracking process | 30 MB/s |
| Daily healthy performance index feedback | 15 MB/s |
| Streaming feedback | 15 MB/s |
| Plotter feedback | 3 MB/s |

In some embodiments, the interface circuit 130 is configured to obtain the lookup table from the memory 160, and the request Q2 includes a type indicator of the task T2 to be performed on the control circuit 140. The interface circuit 130 recognizes the type indicator in the request Q2, compares the type indicator with the test task types in the lookup table, and selects one from the reference data rates as the data rate corresponding to the request Q2. For example, a data rate corresponding to the request Q2 with the type indicator indicating "lot monitor tracking process" will be estimated as 30 MB/s according to the demonstrational example in Table 1.

In some embodiments, the data rate of the data stream D1 can be calculated by estimating a data rate in reference with a task type of the task T1. In some embodiments, the data rate of the data stream D1 can be estimated according to an average data rate in association with the previously performed task with the same task type as the task T1. In some embodiments, the data rate of the data stream D1 can be estimated according to the lookup table.

In operation S312, the interface circuit 130 determines whether a sum of the data rates of the data stream D1 and the data stream D2 exceeds a bandwidth of the data switch 120, which is coupled between the control circuit 140 and the processor 110. The bandwidth of the data switch 120 indicates the maximum rate of data transfer across the data switch 120. In some embodiment, the bandwidth is a known bit rate decided by a capability of the data switch 120.

In a condition that the data rate of the data stream D1 is calculated to be 80 MB/s, the data of the data stream D1 is estimated to be 30 MB/s and the bandwidth of the data switch 120 is known as 125 MB/s, the interface circuit 130 will decides that the sum of the data rates of the data stream D1 and the data stream D2 complies with the bandwidth of the data switch 120 (i.e., 80 MB/s+30 MB/s<125 MB/s), and operations S314 and S316 will be performed in this condition.

Reference is made to FIG. 4. FIG. 4 illustrates data transmissions of the device 100 under the condition that the sum of the data rates of the data stream D1 and the data stream D2 complies with the bandwidth of the data switch 120. For illustration, the interface circuit 130 passes the request Q2 to the control circuit 140 in FIG. 4 under this condition. In operation S314, the control circuit 140 performs the task T2 according to the request Q2. In some embodiments, the task T2 is performed on the control circuit 140, other than the task T1 which is already performed since operation S304. In operation S316, the control circuit 140 transmits the data stream D1 and the data stream D2 to the processor 110. In some embodiments, the data stream D1 and the data stream D2 are transmitted concurrently from the control circuit 140 to the processor 110.

In a condition that the data rate of the data stream D1 is calculated to be 80 MB/s, the data of the data stream D1 is estimated to be 60 MB/s and the bandwidth of the data switch 120 is known as 125 MB/s, the interface circuit 130 will decides that the sum of the data rates of the data stream D1 and the data stream D2 exceeds the bandwidth of the data switch 120 (i.e., 80 MB/s+60 MB/s>125 MB/s), and the operations S318 and S320.

Reference is made to FIG. 5. FIG. 5 illustrates data transmissions of the device 100 under the condition that the sum of the data rates of the data stream D1 and the data stream D2 exceeds the bandwidth of the data switch 120. For illustration, the interface circuit 130 passes the request Q2 to the control circuit 140 and also the interface circuit 130 sends an instruction to terminate the task T1 to the control circuit 140 in FIG. 5 under this condition. In operation S318, the control circuit 140 performs the task T2 according to the request Q2 and also terminates the task T1 according to the instruction sent from the interface circuit 130. In operation S320, the control circuit 140 transmits the data stream D2 to the processor 110. Under this condition, the task T1 is no longer performed on the control circuit 140, and the data stream D1 no longer occupies any bandwidth of the data switch 120. In some embodiments, the data stream D2 is able to be transmitted from the control circuit 140 to the processor 110.

Figure 6:
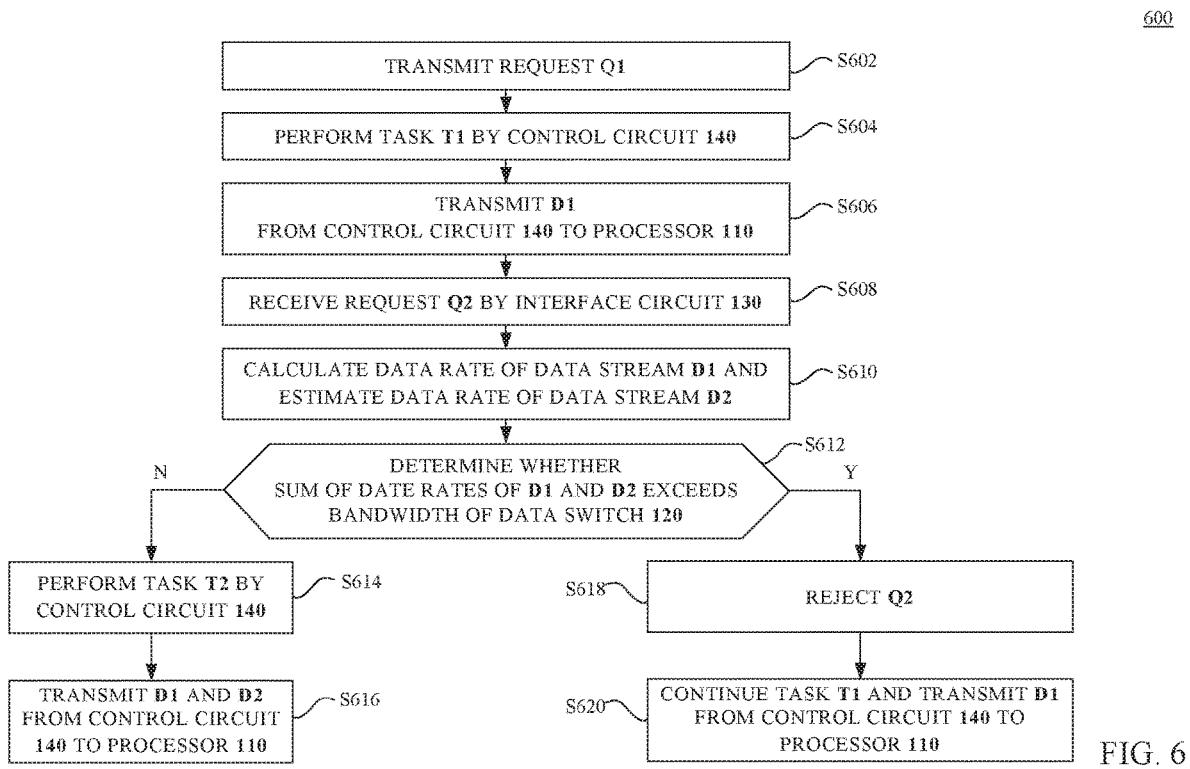
FIG. 6 is a flow chart of a method suitable to be applied on the device in FIG. 1 and FIG. 2 in accordance with some embodiments of the present disclosure.
Figure 7:
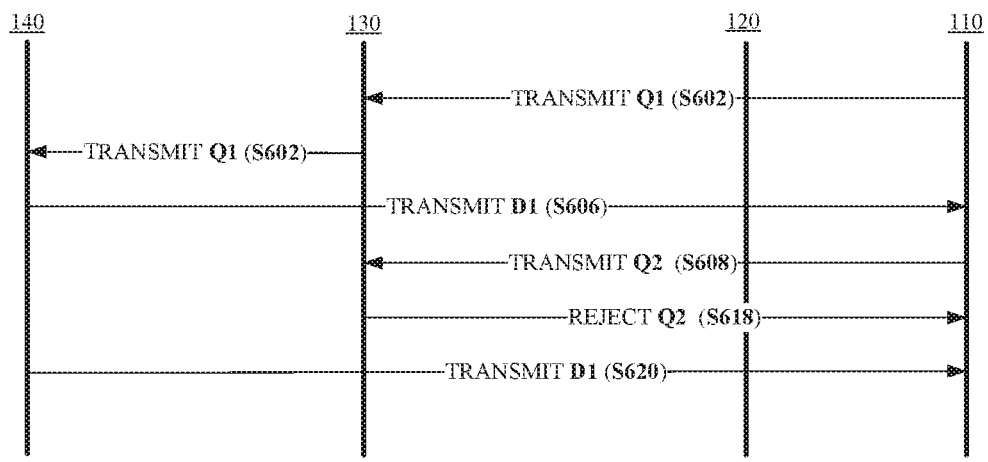
FIG. 7 is a data flow diagram illustrating data transmissions of the device performing the method in FIG. 6 in accordance with some embodiments of the present disclosure.

Reference is now made to FIG. 6 and FIG. 7. FIG. 6 is a flow chart of a method 600 suitable to be applied on the device 100 in FIG. 1 and FIG. 2, in accordance with some embodiments of the present disclosure. FIG. 7 is a data flow diagram illustrating data transmissions of the device 100 performing the method 600 in FIG. 6, in accordance with some embodiments of the present disclosure. For ease of understanding, as an example, the method 600 is described below with reference to FIG. 1 and FIG. 2.

For illustration, the method 600 in FIG. 6 includes operations S602-S620. In operation S602, the request Q1 is transmitted from the processor 110 to the control circuit 140. In operation S604, the control circuit 140 performs the task T1 according to the request Q1 from the processor 110. In operation S606, the control circuit 140 transmits the data stream D1 generated in the task T1 to the processor 110. In operation S608, the interface circuit 130 receives the request Q2 from the processor 110. The request Q2 is utilized for triggering the task T2 to be performed by the control circuit 140. In operation S610, the interface circuit 130 calculates a data rate for transmitting the data stream D1 generated in the task T1, and also the interface circuit 130 estimates another data rate for transmitting data stream D2 to be generated in the task T2. In operation S612, the interface circuit 130 determines whether a sum of the data rates of the data stream D1 and the data stream D2 exceeds a bandwidth of the data switch 120, which is coupled between the control circuit 140 and the processor 110. In operation S614, the control circuit 140 performs the task T2 according to the request Q2. In some embodiments, the task T2 is performed on the control circuit 140, other than the task T1 which is already performed since operation S604. In operation S616, the control circuit 140 transmits the data stream D1 and the data stream D2 to the processor 110. In some embodiments, the data stream D1 and the data stream D2 are transmitted concurrently from the control circuit 140 to the processor 110. Operations S602-S616 in FIG. 6 are similar to operations S302-S316 in aforesaid embodiments shown in FIG. 3.

Reference is made to FIG. 7. FIG. 7 illustrates data transmissions of the device 100 under the condition that the sum of the data rates of the data stream D1 and the data stream D2 exceeds the bandwidth of the data switch 120. For illustration, in operation S618, the interface circuit 130 rejects the request Q2, and returns the rejected request Q2 to the processor 110. In operation S620, the control circuit 140 continuously transmitting the data stream D1 to the processor 110. Under this condition, the request Q2 is rejected and the task T2 is not performed. In some embodiments, control circuit 140 keeps generating the data stream D1 and transmitting the data stream D1 to the processor 110.

Figure 8:
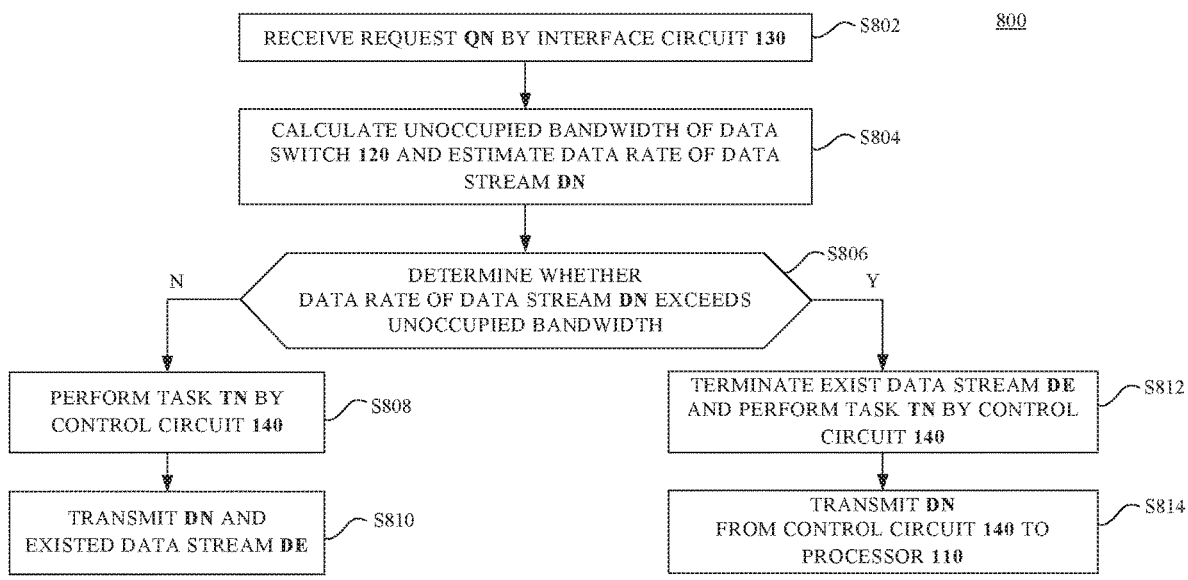
FIG. 8 is a flow chart of a method suitable to be applied on the device in FIG. 1 and FIG. 2, in accordance with some embodiments of the present disclosure.
Figure 9:
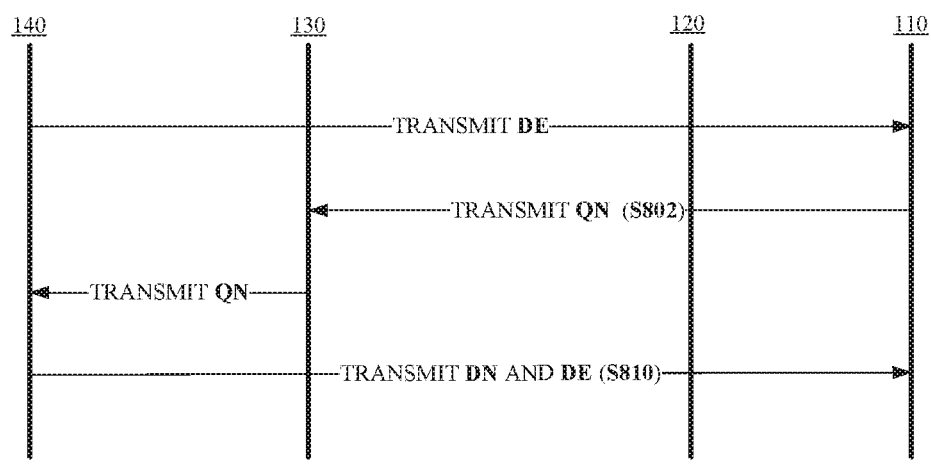
FIG. 9 is a data flow diagram illustrating data transmissions of the device performing the method in FIG. 8 in accordance with some embodiments of the present disclosure.
Figure 10:
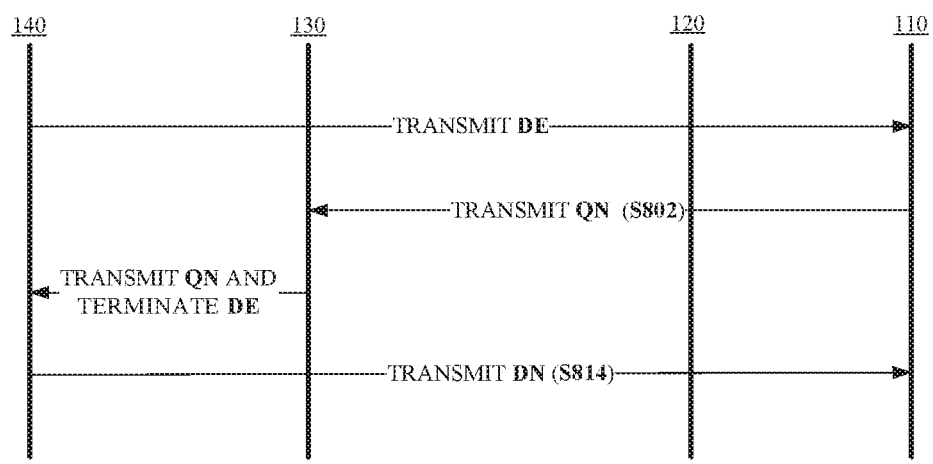
FIG. 10 is a data flow diagram illustrating data transmissions of the device performing the method in FIG. 8 in accordance with some embodiments of the present disclosure.

Reference is now made to FIG. 8, FIG. 9 and FIG. 10. FIG. 8 is a flow chart of a method 800 suitable to be applied on the device 100 in FIG. 1 and FIG. 2, in accordance with some embodiments of the present disclosure. FIG. 9 and FIG. 10 are data flow diagrams illustrating data transmissions of the device 100 performing the method 800 in FIG. 8, in accordance with some embodiments of the present disclosure. For ease of understanding, as an example, the method 800 is described below with reference to FIG. 1 and FIG. 2.

The method 800 includes operations S802-S814. The processor 110 is able to trigger the control circuit 140 to perform one or more tasks. For illustration, the one or more tasks performed on the control circuit 140 will generate an existed data stream DE in FIG. 9 and FIG. 10. The existed data stream DE will occupy a portion of the bandwidth of the data switch 120. In operation S802, the interface circuit 130 receives a request QN transmitted from the processor 110. The request QN is utilized to trigger the control circuit 140 to perform a task TN among an advance diagnostic tool test, a calibration performance diagnostic test, an event trigger data collection process, a lot monitor tracking process, a daily healthy performance index feedback, a streaming feedback and a plotter feedback.

In some embodiments, the request QN will be evaluated by the interface circuit 130 before reaching the control circuit 140. Based on operations S804 and S806, the interface circuit 130 will decide whether to pass the request QN to the control circuit 140 or not.

In operation S804, the interface circuit 130 calculates an unoccupied bandwidth on the data switch 120 and estimating a data rate for transmitting data to be generated in the task TN. In some embodiments, the unoccupied bandwidth is calculated by calculating an occupied bandwidth utilized by the existed data stream DE and deducting the occupied bandwidth from a total bandwidth of the data switch 120. The total bandwidth of the data switch 120 indicates the maximum rate of data transfer across the data switch 120. In some embodiment, the bandwidth is a known bit rate decided by a capability of the data switch 120.

In some embodiments, the request QN includes a type indicator of the task T2 to be performed on the control circuit 140. Since the data stream DN is not generated yet, the data rate of the data stream D2 is estimated by the interface circuit 130, for example, according to the type indicator in the request QN. In some embodiments, the interface circuit 130 recognizes the type indicator in the request Q2, matches the type indicator with a previously performed task on the control circuit 140, and estimates the data rate corresponding to the request QN according to an average data rate in association with the previously performed task. In some embodiments, the memory 160 may store a lookup table. The lookup table records task types and reference data rates in association with the task types. A demonstrational example of the lookup table can be referred to aforesaid Table 1.

In some embodiments, the interface circuit 130 is configured to obtain the lookup table from the memory 160, and the request QN includes a type indicator of the task TN to be performed on the control circuit 140. The interface circuit 130 recognizes the type indicator in the request QN, compares the type indicator with the test task types in the lookup table, and selects one from the reference data rates as the data rate corresponding to the request QN.

In operation S806, the interface circuit 130 determines whether the data rate corresponding to the request QN exceeds the unoccupied bandwidth.

In a condition that the data rate of the data stream DN is estimated to be 30 MB/s and the unoccupied bandwidth of the data switch 120 is calculated to be 50 MB/s, the interface circuit 130 will decides that the data rate corresponding to the request QN complies with the unoccupied bandwidth of the data switch 120 (i.e., 30 MB/s<50 MB/s), and operations S808 and S810 will be performed in this condition.

Reference is made to FIG. 9. FIG. 9 illustrates data transmissions of the device 100 under the condition that the data rate corresponding to the request QN complies with the unoccupied bandwidth of the data switch 120. For illustration, the interface circuit 130 passes the request QN to the control circuit 140 in FIG. 9 under this condition. In operation S808, the control circuit 140 performs the task TN according to the request QN. In some embodiments, the task TN is performed on the control circuit 140, other than the one or more existed tasks which are already performed on the control circuit 140. In operation S810, the control circuit 140 transmits the data stream DN and the existed data stream DE to the processor 110. In some embodiments, the data stream DN and the existed data stream DE are transmitted concurrently from the control circuit 140 to the processor 110.

In a condition that the data rate of the data stream DN is estimated to be 30 MB/s and the unoccupied bandwidth of the data switch 120 is calculated to be 50 MB/s, the interface circuit 130 will decide that the data rate corresponding to the request QN exceeds the unoccupied bandwidth of the data switch 120 (i.e., 30 MB/s>20 MB/s), and operations S812 and S814 will be performed in this condition.

Reference is made to FIG. 10. FIG. 10 illustrates data transmissions of the device 100 under the condition that the data rate corresponding to the request QN exceeds the unoccupied bandwidth of the data switch 120. For illustration, the interface circuit 130 passes the request Q2 to the control circuit 140 and also the interface circuit 130 sends an instruction to terminate the existed data stream DE to the control circuit 140 in FIG. 5 under this condition. In operation S812, the control circuit 140 performs the target task TN according to the request QN and also terminates the existed data stream DE according to the instruction sent from the interface circuit 130. In operation S814, the control circuit 140 transmits the data stream DN to the processor 110.

The predetermined sequences, including the ascending numerical order and/or the descending numerical order, are given for illustrative purposes only. Various kinds of orders are within the contemplated scope of the present disclosure.

For ease of understanding, the embodiments above are given with an application of fabricating two switches. The embodiments above are able to be applied to fabricate a single switch or two more switches. For illustrative purposes, the embodiments above are described as implementing the switches. The present disclosure is not limited thereto. Various elements are able to be implemented according to the embodiments above, and thus are the contemplated scope of the present disclosure.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a method that includes the operation below. A first task is performed by a control circuit according to a first request from a processor. A second request, for triggering a second task to be performed by the control circuit, is received by an interface circuit. A first data rate, for transmitting first data generated in the first task, is calculated by the interface circuit. A second data rate, for transmitting second data to be generated in the second task, is estimated by the interface circuit. The second task other than the first task is performed by the control circuit. The first data and the second data are transmitted from the control circuit to the processor in a condition that a sum of the first data rate and the second data rate complies with a bandwidth of a data switch coupled between the control circuit and the processor.

Also disclosed is a device that includes a control circuit and an interface circuit. The control circuit is configured to perform a first task according to a first request from a processor. The interface circuit is configured to receive a second request from the processor for triggering a second task to be performed by the control circuit. The interface circuit is configured to calculate a first data rate for transmitting first data generated in the first task and estimate a second data rate for transmitting second data to be generated in the second task. In a condition that a sum of the first data rate and the second data rate complies with a bandwidth of a data switch coupled between the control circuit and the processor, the interface circuit is configured to trigger the control circuit to perform the second task other than the first task and to transmit the first data and the second data from the control circuit to the processor.

Also disclosed is a method that includes the operation below. A request is received by an interface circuit from a processor for triggering a target task to be performed by a control circuit. An unoccupied bandwidth on a data switch, which is coupled between the control circuit and the processor, is calculated by the interface circuit. A data rate for transmitting data to be generated in the target task is estimated by the interface circuit. In a condition that the data rate complies with the unoccupied bandwidth, the target task is performed by the control circuit and the data generated by the target task is transmitted from the control circuit to the processor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
performing a first task, by a control circuit, according to a first request from a processor;
receiving a second request, by an interface circuit, for triggering a second task to be performed by the control circuit;
calculating a first data rate, by the interface circuit, for transmitting first data generated in the first task, and estimating a second data rate, by the interface circuit, for transmitting second data to be generated in the second task, wherein the second request comprises a type indicator of the second task, and estimating the second data rate comprises:
obtaining a lookup table recording a plurality of task types and a plurality of reference data rates in association with the task types, the task types comprises different tests, processes or feedback tasks performed on the control circuit for controlling a lithography light source;
recognizing the type indicator in the second request; and
selecting one from the reference data rates as the second data rate by comparing the type indicator with the task types; and
performing the second task, by the control circuit, other than the first task, and transmitting the first data and the second data from the control circuit to the processor, in a condition that a sum of the first data rate and the second data rate complies with a bandwidth of a data switch coupled between the control circuit and the processor.

2. The method of claim 1, wherein in the condition that the sum of the first data rate and the second data rate complies with the bandwidth of the data switch, the first data and the second data are data streams transmitted concurrently from the control circuit through the data switch to the processor.

3. The method of claim 1, further comprising:
terminating the first task and performing the second task, by the control circuit, and transmitting the second data from the control circuit to the processor, in a condition that the sum of the first data rate and the second data rate exceeds the bandwidth of the data switch.

4. The method of claim 1, further comprising:
rejecting the second request from the processor and continuously performing the first task, by the control circuit, in a condition that the sum of the first data rate and the second data rate exceeds the bandwidth of the data switch.

5. A device, comprising:
a control circuit configured to perform a first task according to a first request from a processor;
a lithography light source coupled with the control circuit, wherein the control circuit is configured to control the lithography light source;
an interface circuit configured to:
receive a second request from the processor for triggering a second task to be performed by the control circuit, wherein the second request comprises a type indicator of the second task;
calculate a first data rate for transmitting first data generated in the first task and estimate a second data rate for transmitting second data to be generated in the second task, and the second data rate is estimated by:
obtaining a lookup table recording a plurality of task types and a plurality of reference data rates in association with the task types, wherein the task types comprises different tests, processes or feedback tasks performed on the control circuit for controlling a lithography light source;
recognizing the type indicator in the second request; and
selecting one from the reference data rates as the second data rate by comparing the type indicator with the task types; and
in a condition that a sum of the first data rate and the second data rate complies with a bandwidth of a data switch coupled between the control circuit and the processor, trigger the control circuit to perform the second task other than the first task and to transmit the first data and the second data from the control circuit to the processor.

6. The device of claim 5, wherein in the condition that the sum of the first data rate and the second data rate complies with the bandwidth of the data switch, the first data and the second data are data streams transmitted concurrently from the control circuit through the data switch to the processor.

7. The device of claim 5, wherein in a condition that the sum of the first data rate and the second data rate complies with the bandwidth of the data switch, the interface circuit triggers the control circuit to terminate the first task, to perform the second task and to transmit the second data from the control circuit to the processor.

8. The device of claim 5, wherein in a condition that the sum of the first data rate and the second data rate exceeds the bandwidth of the data switch, the interface circuit rejects the second request from the processor, the control circuit continuously performs the first task.

9. The device of claim 5, wherein the control circuit comprises a plurality of controllers, the controllers are configured to control laser emission, droplet feedback, timing, emission energy, target formation metrology or focus metrology of the lithography light source.

10. A method, comprising:
receiving a request, by an interface circuit, from a processor for triggering a target task to be performed by a control circuit;
calculating an unoccupied bandwidth, by the interface circuit, on a data switch coupled between the control circuit and the processor and estimating a data rate, by the interface circuit, for transmitting data to be generated in the target task, wherein the request comprises a type indicator of the target task, and estimating the second data rate comprises:
obtaining a lookup table recording a plurality of task types and a plurality of reference data rates in association with the task types, wherein the task types comprises different tests, processes or feedback tasks performed on the control circuit for controlling a lithography light source;
recognizing the type indicator in the request; and
selecting one from the reference data rates as the data rate by comparing the type indicator with the task types; and
performing the target task, by the control circuit, and transmitting the data generated by the target task from the control circuit to the processor, in a condition that the data rate complies with the unoccupied bandwidth.

11. The method of claim 10, wherein calculating the unoccupied bandwidth comprises:
calculating an occupied bandwidth utilized by an existed data stream between the control circuit and the processor; and
deducting the occupied bandwidth from a total bandwidth of the data switch to calculate the unoccupied bandwidth.

12. The method of claim 11, wherein in the condition that the data rate complies with the unoccupied bandwidth, the data generated in the target task and the existed data stream are transmitted concurrently from the control circuit through the data switch to the processor.

13. The method of claim 11, further comprising:
terminating the existed data stream and performing the target task, by the control circuit, and transmitting the data generated by the target task from the control circuit to the processor, in a condition that the data rate exceeds the unoccupied bandwidth.

14. The method of claim 10, further comprising:
rejecting the request from the processor for triggering the target task in a condition that the data rate exceeds the unoccupied bandwidth.

15. The method of claim 1, wherein a type of the second task triggered by the second request is different from a type of the first task performed on the control circuit.

16. The method of claim 15, wherein the first task is an advance diagnostic tool test and the second task is a calibration performance diagnostic test.

17. The method of claim 1, wherein the control circuit comprises a plurality of controllers, the controllers are configured to control laser emission, droplet feedback, timing, emission energy, target formation metrology or focus metrology of the lithography light source.

18. The device of claim 5, wherein a type of the second task triggered by the second request is different from a type of the first task performed on the control circuit.

19. The device of claim 18, wherein the first task is an advance diagnostic tool test and the second task is a calibration performance diagnostic test.

20. The method of claim 10, wherein the control circuit comprises a plurality of controllers, the controllers are configured to control laser emission, droplet feedback, timing, emission energy, target formation metrology or focus metrology of the lithography light source.

* * * * *